(12) United States Patent
Maki et al.

(10) Patent No.: US 11,545,383 B2
(45) Date of Patent: Jan. 3, 2023

(54) SUBSTRATE POSITIONING APPARATUS, SUBSTRATE POSITIONING METHOD, AND BONDING APPARATUS

(71) Applicant: Tokyo Electron Limited, Tokyo (JP)

(72) Inventors: Tetsuya Maki, Koshi (JP); Toshifumi Inamasu, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 52 days.

(21) Appl. No.: 17/164,928

(22) Filed: Feb. 2, 2021

(65) Prior Publication Data
US 2021/0249293 A1    Aug. 12, 2021

(30) Foreign Application Priority Data

Feb. 10, 2020    (JP) .............................. JP2020-020272

(51) Int. Cl.
| | |
|---|---|
| *H01L 21/68* | (2006.01) |
| *H01L 23/00* | (2006.01) |
| *H01L 21/683* | (2006.01) |
| *H01L 21/677* | (2006.01) |
| *F16C 29/02* | (2006.01) |
| *H01L 21/687* | (2006.01) |

(52) U.S. Cl.
CPC .............. *H01L 21/68* (2013.01); *F16C 29/02* (2013.01); *H01L 21/67718* (2013.01); *H01L 21/6838* (2013.01); *H01L 21/68764* (2013.01); *H01L 21/68785* (2013.01); *H01L 24/74* (2013.01)

(58) Field of Classification Search
CPC ..... H01L 21/68; H01L 21/681; H01L 21/682; B24B 37/27; B24B 37/30; B24B 37/32; B24B 37/345; B24B 37/0069
USPC ..... 269/309–310, 903, 289 R; 451/285–287; 188/378, 379, 381, 67
See application file for complete search history.

(56) References Cited

U.S. PATENT DOCUMENTS

| | | | | |
|---|---|---|---|---|
| 4,139,243 A | * | 2/1979 | Landsman | ........... H04N 1/0607 384/114 |
| 2007/0242241 A1 | * | 10/2007 | Nagasaka | ........... G03F 7/70891 355/30 |

FOREIGN PATENT DOCUMENTS

JP    2018-147944 A    9/2018

* cited by examiner

*Primary Examiner* — Gerald McClain
(74) *Attorney, Agent, or Firm* — Pearne & Gordon LLP

(57) ABSTRACT

A substrate positioning apparatus includes a holder and a rotating device. The holder is configured to hold a substrate. The rotating device is configured to rotate the holder. The rotating device includes a rotation shaft, a bearing member, a base member, a driving unit and a damping device. The rotation shaft is fixed to the holder. The bearing member is configured to support the rotation shaft in a non-contact state. The bearing member is fixed on the base member. The driving unit is configured to rotate the rotation shaft. The damping device includes a rail connected to the base member and a slider connected to the rotation shaft, and is configured to produce a damping force against a relative operation between the rotation shaft and the base member by a resistance generated between the rail and the slider.

8 Claims, 5 Drawing Sheets

SUBSTRATE POSITIONING APPARATUS, SUBSTRATE POSITIONING METHOD, AND BONDING APPARATUS

CROSS-REFERENCE TO RELATED APPLICATION

This application claims the benefit of Japanese Patent Application No. 2020-020272 filed on Feb. 10, 2020, the entire disclosure of which is incorporated herein by reference.

TECHNICAL FIELD

The various aspects and embodiments described herein pertain generally to a substrate positioning apparatus, a substrate positioning method and a bonding apparatus.

BACKGROUND

Conventionally, there is known a bonding apparatus configured to bond substrates such as semiconductor wafers (see, for example, Patent Document 1).

Patent Document 1: Japanese Patent Laid-open Publication No. 2018-147944

SUMMARY

In one exemplary embodiment, a substrate positioning apparatus includes a holder and a rotating device. The holder is configured to hold a substrate. The rotating device is configured to rotate the holder. The rotating device includes a rotation shaft, a bearing member, a base member, a driving unit and a damping device. The rotation shaft is fixed to the holder. The bearing member is configured to support the rotation shaft in a non-contact state. The bearing member is fixed on the base member. The driving unit is configured to rotate the rotation shaft. The damping device includes a rail connected to the base member and a slider connected to the rotation shaft, and is configured to produce a damping force against a relative operation between the rotation shaft and the base member by a resistance generated between the rail and the slider.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
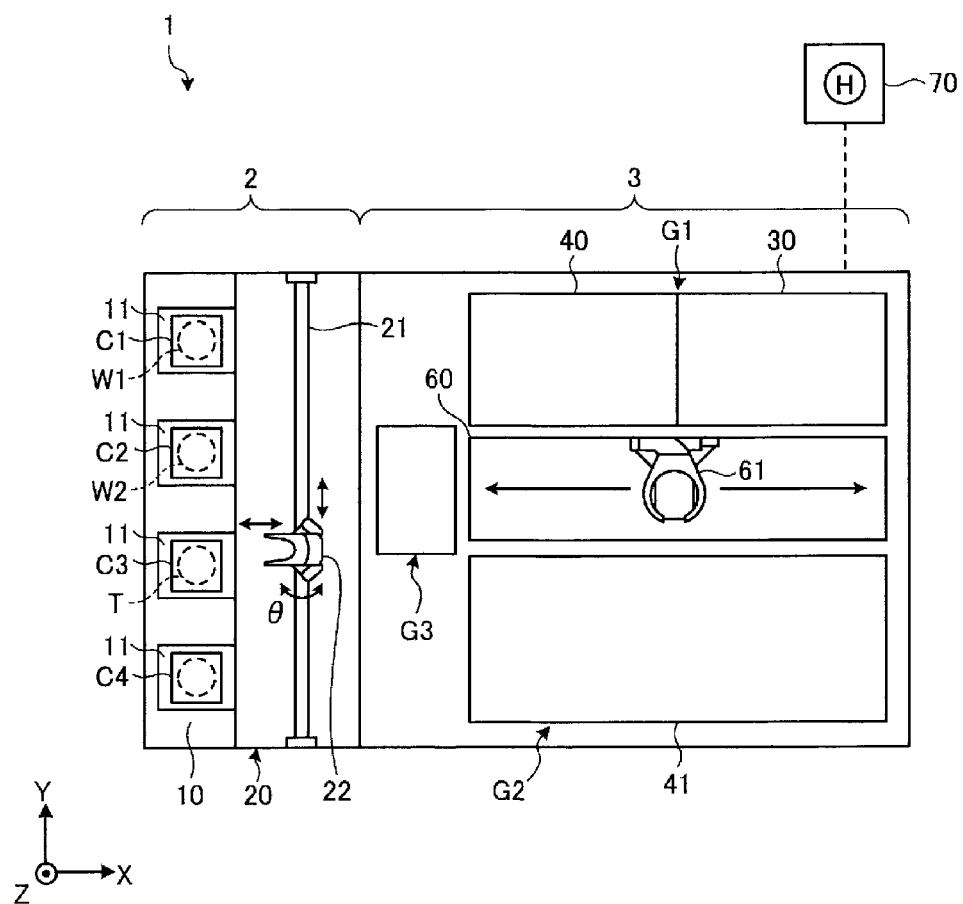
FIG. 1 is a schematic diagram illustrating a configuration of a bonding system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various embodiments (hereinafter, referred to as "exemplary embodiments") for implementing a substrate positioning apparatus, a substrate positioning method and a bonding apparatus according to the present disclosure will be described in detail with reference to the accompanying drawings. However, it should be noted that the present disclosure is not limited by the following exemplary embodiments. Further, the various exemplary embodiments can be appropriately combined as long as the contents of processings are not contradictory. Furthermore, in the following exemplary embodiments, same parts will be assigned same reference numerals and redundant description will be omitted.

Further, in the following exemplary embodiments, expressions such as "constant," "perpendicular," "vertical" and "parallel" may be used. These expressions, however, do not imply strictly "constant", "perpendicular," "vertical" and "parallel". That is, these expressions allow some tolerable errors in, for example, manufacturing accuracy, installation accuracy, or the like.

In order to ease understanding of the following description, the X-axis direction, Y-axis direction and Z-axis direction which are orthogonal to each other are defined, and an orthogonal coordinate system in which the positive Z-axis direction is regarded as a vertically upward direction may be used in the following drawings. Further, a rotational direction around a vertical axis may be referred to as "θ direction."

In a bonding apparatus configured to bond substrates, positioning of the substrates in a rotational direction is performed before the substrates are bonded. Improvement of this positioning accuracy in the rotational direction leads to improvement of bonding accuracy for the substrates. Thus, it is required to improve the positioning accuracy for the substrates in the rotational direction.

Further, the improvement of the positioning accuracy for the substrate in the rotational direction is also required in another apparatus such as an inspection apparatus (prober) for the substrate without being limited to the bonding apparatus. In the following, exemplary embodiments will be described for a case where a substrate positioning apparatus and a substrate positioning method according to the present disclosure are applied to the bonding apparatus. However, the substrate positioning apparatus and the substrate positioning method according to the present disclosure are also applicable to various other types of apparatuses without being limited to the bonding apparatus.

<Configuration of Bonding System>

Figure 2:
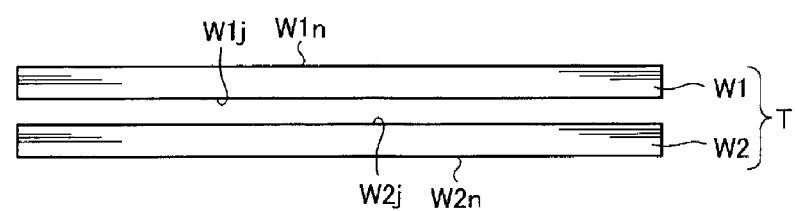
FIG. 2 is a schematic diagram illustrating states of a first substrate and a second substrate before being bonded according to the exemplary embodiment.

First, a configuration of a bonding system according to an exemplary embodiment will be explained with reference to FIG. 1 and FIG. 2. FIG. 1 is a schematic diagram illustrating a configuration of the bonding system according to the exemplary embodiment. FIG. 2 is a schematic diagram illustrating a state before a first substrate and a second substrate are bonded according to the exemplary embodiment.

A bonding system 1 shown in FIG. 1 forms a combined substrate T by bonding a first substrate W1 and a second substrate W2 (see FIG. 2).

The first substrate W1 and the second substrate W2 are single crystalline silicon wafers, and a multiple number of electronic circuits are formed on surfaces of these substrates. The first substrate W1 and the second substrate W2 have the substantially same diameter. Further, either one of the first substrate W1 and the second substrate W2 may be a bare substrate on which no electronic circuit is formed.

In the following description, as shown in FIG. 2, among surfaces of the first substrate W1, a surface to be bonded to the second substrate W2 will be referred to as "bonding surface W1j", and a surface opposite to the bonding surface W1j will be referred to as "non-bonding surface W1n". Further, among surfaces of the second substrate W2, a surface to be bonded to the first substrate W1 will be referred to as "bonding surface W2j", and a surface opposite to the bonding surface W2j will be referred to as "non-bonding surface W2n."

As depicted in FIG. 1, the bonding system 1 includes a carry-in/out station 2 and a processing station 3. The carry-in/out station 2 is disposed at the negative X-axis side of the processing station 3, and connected as a single body with the processing station 3.

The carry-in/out station 2 includes a placing table 10 and a transfer section 20. The placing table 10 is equipped with a multiple number of placing plates 11. Respectively provided on the placing plates 11 are cassettes C1 to C4 each of which accommodates therein a plurality of (e.g., 25 sheets of) substrates horizontally. The cassette C1 accommodates therein a plurality of first substrates W1; the cassette C2, a plurality of second substrates W2; and the cassette C3, a plurality of combined substrates T. The cassette C4 is a cassette for collecting, for example, a problematic substrate. Further, the number of the cassettes C1 to C4 placed on the placing plates 11 is not limited to the shown example.

The transfer section 20 is provided adjacent to the positive X-axis side of the placing table 10. Provided in the transfer section 20 are a transfer path 21 extending in the Y-axis direction and a transfer device 22 configured to be movable along the transfer path 21. The transfer device 22 is configured to be movable in the X-axis direction as well as in the Y-axis direction and pivotable around the Z-axis. The transfer device 22 is also configured to transfer the first substrates W1, the second substrates W2 and the combined substrates T between the cassettes C1 to C4 placed on the placing plates 11 and a third processing block G3 of the processing station 3 to be described later.

For example, three processing blocks G1, G2 and G3 are provided in the processing station 3. The first processing block G1 is disposed at a rear side (positive Y-axis side of FIG. 1) of the processing station 3, and the second processing block G2 is provided at a front side (negative Y-axis side of FIG. 1) of the processing station 3. Further, the third processing block G3 is disposed at a carry-in/out station 2 side (negative X-axis side of FIG. 1) of the processing station 3.

Provided in the first processing block G1 is a surface modifying apparatus 30 configured to modify the bonding surface W1j of the first substrate W1 and the bonding surface W2j of the second substrate W2. The surface modifying apparatus 30 cuts a $SiO_2$ bond on the bonding surfaces W1j and W2j of the first substrate W1 and the second substrate W2 into a single bond of SiO, thus allowing the bonding surfaces W1j and W2j to be modified such that they are easily hydrophilized afterwards.

Specifically, in the surface modifying apparatus 30, an oxygen gas or a nitrogen gas as a processing gas is excited into plasma under, for example, a decompressed atmosphere to be ionized. As these oxygen ions or nitrogen ions are irradiated to the bonding surfaces W1j and W2j of the first and second substrates W1 and W2, the bonding surfaces W1j and W2j are plasma-processed and modified.

Further, in the first processing block G1, a surface hydrophilizing apparatus 40 is disposed. The surface hydrophilizing apparatus 40 is configured to hydrophilize and clean the bonding surfaces W1j and W2j of the first substrate W1 and the second substrate W2 with, for example, pure water. To elaborate, the surface hydrophilizing apparatus 40 supplies the pure water onto the first substrate W1 or the second substrate W2 while rotating the first substrate W1 or the second substrate W2 held by, for example, a spin chuck. Accordingly, the pure water supplied onto the first substrate W1 or the second substrate W2 is diffused on the bonding surface W1j of the first substrate W1 or the bonding surface W2j of the second substrate W2, so that the bonding surfaces W1j and W2j are hydrophilized.

Here, though the surface modifying apparatus 30 and the surface hydrophilizing apparatus 40 are arranged side by side, the surface hydrophilizing apparatus 40 may be stacked on top of or under the surface modifying apparatus 30.

In the second processing block G2, a bonding apparatus 41 is disposed. The bonding apparatus 41 is configured to bond the first substrate W1 and the second substrate W2, which are hydrophilized, by an intermolecular force. A specific configuration of the bonding apparatus 41 will be discussed later.

A transfer section 60 is formed in a region surrounded by the first processing block G1, the second processing block G2 and the third processing block G3. A transfer device 61 is disposed in the transfer section 60. The transfer device 61 is equipped with, for example, a transfer arm which is configured to be movable in a vertical direction and a horizontal direction and pivotable around a vertical axis. This transfer device 61 is moved within the transfer section 60 and transfers the first substrates W1, the second substrates W2 and the combined substrates T to preset devices within the first processing block G1, the second processing block G2 and the third processing block G3 which are adjacent to the transfer section 60.

Furthermore, the bonding system 1 includes a control device 70. The control device 70 controls an operation of the bonding system 1. This control device 70 may be implemented by, for example, a computer and includes a controller and a storage which are not illustrated. The controller includes a microcomputer having a CPU (Central Processing Unit), a ROM (Read Only Memory), a RAM (Random Access Memory), an input/output port, and so forth; and various kinds of circuits. The CPU of the microcomputer implements a control to be described later by reading out a program stored in the ROM and executing the program. Further, the storage may be implemented by, by way of non-limiting example, a semiconductor memory device such as a RAM or a flash memory, or a storage device such as a hard disk or an optical disk.

Further, the program may be recorded on a computer-readable recording medium and installed from the recording medium to the storage of the control device 70. The computer-readable recording medium may be, by way of non-limiting example, a hard disk HD, a flexible disk FD, a compact disk CD, a magnetic optical disk MO, a memory card, or the like.

<Configuration of Bonding Apparatus>

Figure 3:
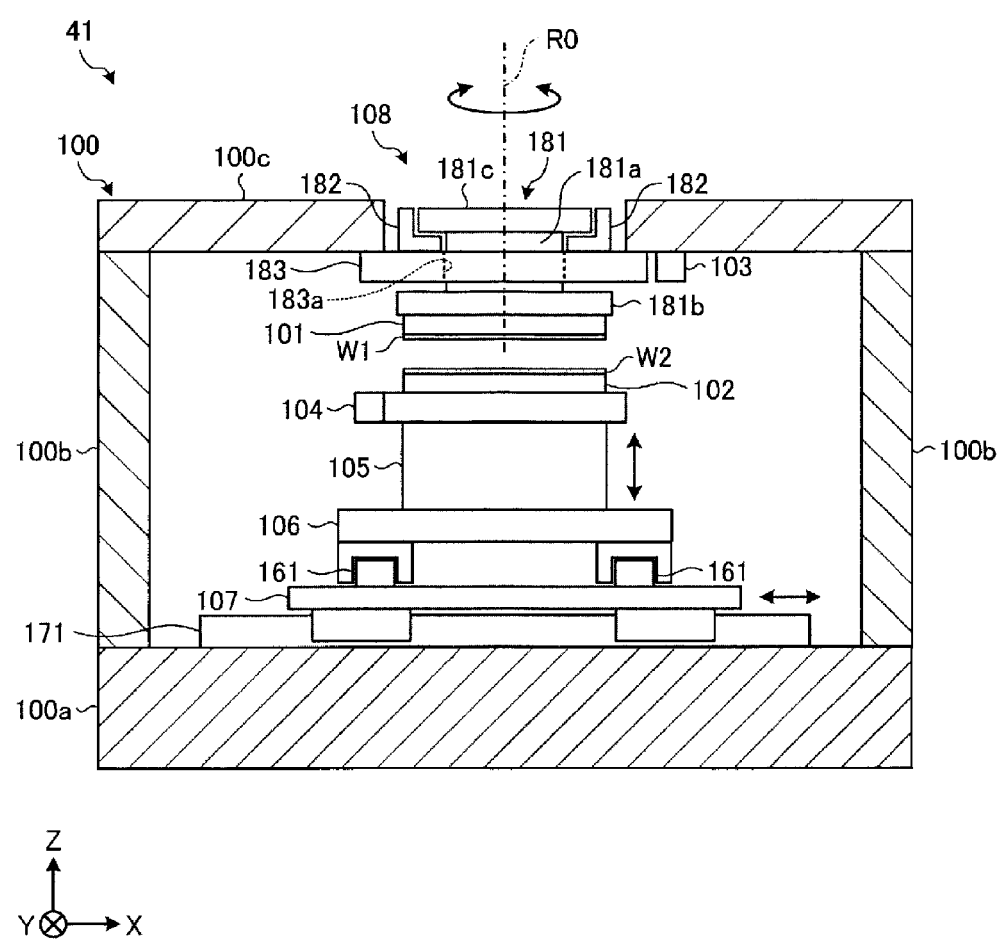
FIG. 3 is a schematic diagram illustrating a configuration of a bonding apparatus according to the exemplary embodiment.

Now, a configuration of the bonding apparatus 41 will be discussed with reference to FIG. 3. FIG. 3 is a schematic diagram illustrating the configuration of the bonding apparatus 41 according to the exemplary embodiment.

As depicted in FIG. 3, the bonding apparatus 41 includes a housing 100, a first holder 101 and a second holder 102. Further, the bonding apparatus 41 is equipped with an upper imaging device 103 and a lower imaging device 104. The bonding apparatus 41 further includes an elevating device 105 (an example of a moving device), a first horizontally moving member 106, a second horizontally moving member 107, and a rotating device 108.

The housing 100 is equipped with, by way of example, a base 100*a*, a multiple number of supporting columns 100*b* standing on the base 100*a*, and a beam 100*c* put on the multiple number of columns 100*b*.

The first holder 101 is, for example, a vacuum chuck, and is connected to a non-illustrated suction device such as a vacuum pump. The first holder 101 is configured to vacuum-attract the first substrate W1 placed on an attraction surface thereof (a bottom surface of the first holder 101) by using a suction force generated by the suction device, thus attracting and holding the first substrate W1 from above.

The second holder 102 is, for example, a vacuum chuck, and is connected to a non-illustrated suction device such as a vacuum pump. The second holder 102 is configured to vacuum-attract the second substrate W2 placed on an attraction surface thereof (a top surface of the second holder 102) by using a suction force generated by the suction device, thus attracting and holding the second substrate W2 from below.

The upper imaging device 103 is configured to image a top surface (bonding surface W2*j*) of the second substrate W2 held by the second holder 102. The upper imaging device 103 is mounted to, for example, the beam 100*c* of the housing 100. The upper imaging device 103 may be, by way of non-limiting example, a CCD (Charge Coupled Device) camera, or the like.

The lower imaging device 104 is configured to image a bottom surface (bonding surface W1*j*) of the first substrate W1 held by the first holder 101. The lower imaging device 104 is mounted to, for example, a side portion of the elevating device 105. By way of non-limiting example, a CCD camera or the like may be used as the lower imaging device 104.

The second holder 102 is fixed to the elevating device 105 which is provided under the second holder 102. The elevating device 105 moves the second holder 102 in the vertical direction (Z-axis direction).

The elevating device 105 is fixed to the first horizontally moving member 106 which is provided under the elevating device 105. The first horizontally moving member 106 moves the elevating device 105 in the horizontal direction. To elaborate, a pair of rails 161 extending in the Y-axis direction is provided under the first horizontally moving member 106, and the first horizontally moving member 106 moves along the pair of rails 161, thus allowing the elevating device 105 to be moved in the Y-axis direction.

These rails 161 are fixed to the second horizontally moving member 107. The second horizontally moving member 107 moves the first horizontally moving member 106 in the horizontal direction with the pair of rails 161 therebetween. To elaborate, a pair of rails 171 extending in the X-axis direction are provided under the second horizontally moving member 107. The second horizontally moving member 107 moves along the pair of rails 171, thus allowing the first horizontally moving member 106 to be moved in the X-axis direction with the pair of rails 161 therebetween. These rails 171 are fixed to the base 100*a* of the housing 100.

The first holder 101 is fixed to the rotating device 108 provided above the first holder 101. The rotating device 108 rotates the first holder 101 around the vertical axis (Z-axis). Accordingly, a position of the first substrate W1 held by the first holder 101 in the θ direction is adjusted.

The rotating device 108 is equipped with a rotation shaft 181 fixed to the first holder 101, a plurality of air bearings 182 supporting the rotation shaft 181 in a non-contact state, and a base member 183 on which the air bearings 182 are fixed.

The rotation shaft 181 includes, for example, a circular column member 181*a* extending in the vertical direction; a first flange member 181*b* provided under the circular column member 181*a*; and a second flange member 181*c* provided on the circular column member 181*a*. The first holder 101 is fixed to a bottom surface of the first flange member 181*b*.

The air bearings 182 are disposed around a periphery of the second flange member 181*c* of the rotation shaft 181. In the exemplary embodiment, the rotating device 108 is equipped with four air bearings 182 (see FIG. 4 to be described later). The four air bearings 182 are arranged at a regular distance therebetween, that is, at an angular distance of 90 degrees therebetween in a circumferential direction of the second flange member 181*c*. Thus, two of the four air bearings 182 are disposed to face each other with a center of the second flange member 181*c* (that is, a center of the rotation shaft 181) therebetween, and the other two air bearings 182 are disposed to face each other with the center of the second flange member 181*c* therebetween.

Here, the rotating device 108 may be equipped with, instead of the plurality of air bearings 182, a single air bearing having a circular ring shape.

The air bearings 182 discharge compressed air vertically upwards toward a bottom surface (an example of a bearing surface) of the second flange member 181*c* from below it, thus allowing the rotation shaft 181 to be lifted. Further, these bearings 182 discharge the compressed air toward a circumferential side surface (an example of a bearing surface) of the second flange member 181*c* from around it. To elaborate, each air bearing 182 discharges the compressed air along a diametrical direction (a direction indicated by a dashed dotted line in FIG. 4) of the second flange member 181*c*. That is, each air bearing 182 discharges the compressed air toward the corresponding air bearing 182 which is disposed to face it with the center of the second flange member 181*c* therebetween.

The compressed air discharged in the horizontal direction from the plurality of air bearings 182 push the rotation shaft 181 in the horizontal direction. Forces which push this rotation shaft 181 in the horizontal direction are balanced at a rotation center R0 (see FIG. 4) of the rotation shaft 181.

The base member 183 is, for example, a flat plate-shaped member, and fixed to the beam 100c of the housing 100. The aforementioned air bearings 182 are fixed on a top surface of this base member 183.

Further, the base member 183 is provided with a through hole 183a which is formed through the base member 183 in the vertical direction. This through hole 183a has a diameter larger than a diameter of the circular column member 181a of the rotation shaft 181. The circular column member 181a of the rotation shaft 181 is inserted through this through hole 183a. The first flange member 181b of the rotation shaft 181 is placed under the base member 183, and the second flange member 181c is disposed above the base member 183. In this way, the rotation shaft 181 and the base member 183 are in a non-contact state.

As stated above, the rotating device 108 according to the exemplary embodiment supports the rotation shaft 181 in the non-contact state by using the plurality of air bearings 182. Accordingly, the rotating device 108 according to the exemplary embodiment is capable of rotating the rotation shaft 181 with a very small force, as compared to a case where the rotation shaft 181 is supported by using a contact-type bearing such as a ball bearing. Thus, the rotating device 108 according to the exemplary embodiment is capable of achieving high responsiveness even when the rotation shaft 181 is rotated at, for example, a nanometer (nm) level.

However, when supporting the rotation shaft 181 in the non-contact state, there may be a problem in the aspect of static balance of the rotation shaft 181. That is, as stated above, the rotation center R0 of the rotation shaft 181 is positioned by the balance of the forces of the compressed air horizontally discharged from the plurality of air bearings 182. This position of the balance, however, may be minutely deviated by an external force such as a vibration. For this reason, in the method of supporting the rotation shaft 181 in the non-contact state, it may be difficult to maintain the rotation center R0 of the rotation shaft 181 with high precision. This static balance issue becomes conspicuous particularly when the rotation shaft 181 is rotated at the nanometer (nm) level.

The deviation of the rotation center R0 of the rotation shaft 181 leads to deterioration of bonding accuracy for the first and second substrates W1 and W2. For the reason, it is desirable to suppress or minimize the deviation of the rotation center R0 of the rotation shaft 181.

In the rotating device 108 according to the present exemplary embodiment, the static balance of the rotation shaft 181 is improved by providing a damping device configured to add a resistance to the driving of the rotation shaft 181. With this damping device, the static balance of the rotation shaft 181 is improved, so that the rotating device 108 according to the exemplary embodiment is capable of improving positioning accuracy of the first substrate W1 in the rotational direction. Below, a specific configuration of the rotating device 108 will be explained.

Figure 4:
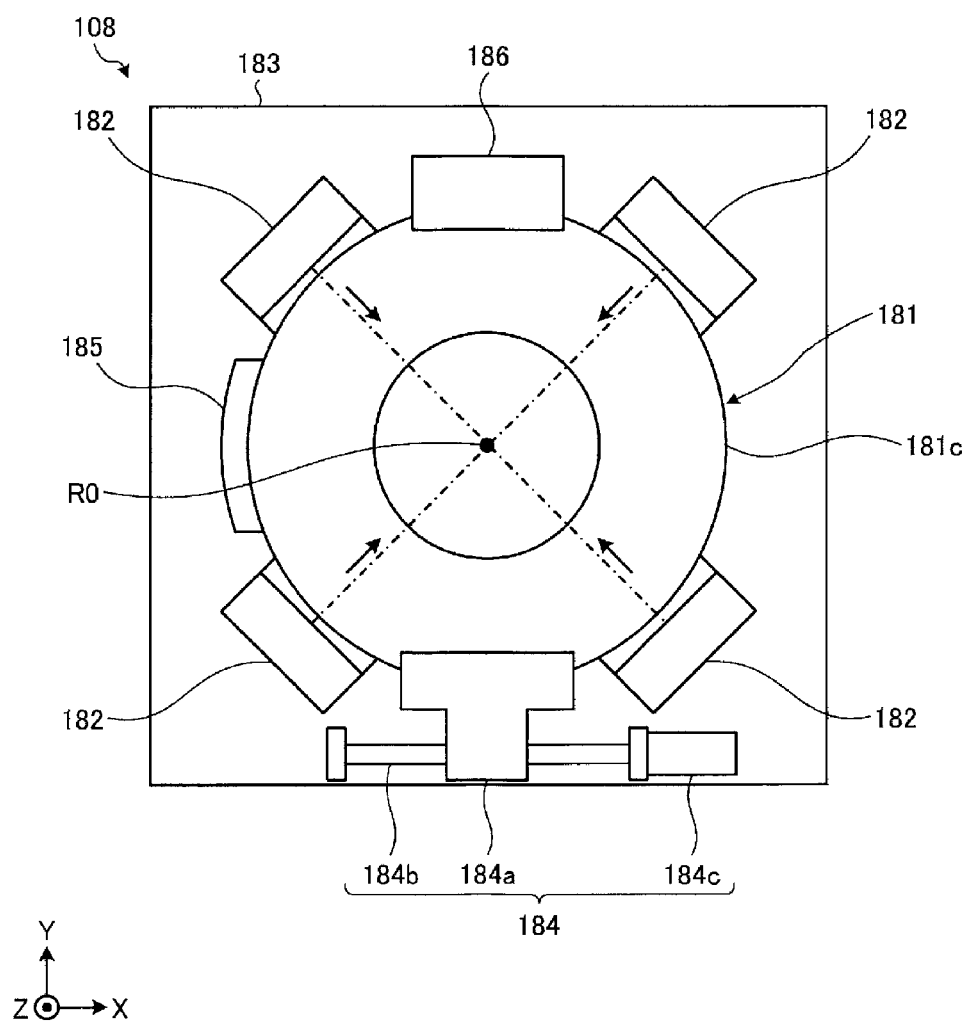
FIG. 4 is a plan view of a rotating device according to the exemplary embodiment.

Further, though not illustrated here, the bonding apparatus 41 is further equipped with a transition device, a position adjusting device, an inverting device, and so forth at a front end of the first holder 101 or the second holder 102 shown in FIG. 4. The transition device accommodates the first substrate W1, the second substrate W2 and the combined substrate T temporarily. The position adjusting device adjusts directions of the first substrate W1 and the second substrate W2 in the horizontal direction. The inverting device inverts a front surface and a rear surface of the first substrate W1.

<Configuration of Rotating Device>

Now, the configuration of the rotating device 108 will be discussed with reference to FIG. 4. FIG. 4 is a plan view of the rotating device 108 according to the exemplary embodiment.

As depicted in FIG. 4, the rotating device 108 is further equipped with a driving device 184, a position sensor 185, and a damping device 186.

The driving device 184 is, by way of non-limiting example, a linearly moving actuator, and is equipped with a slider 184a, a screw shaft 184b, and a driving source 184c. The slider 184a is fixed to the rotation shaft 181 and the screw shaft 184b. The screw shaft 184b extends in the horizontal direction (here, the X-axis direction). The screw shaft 184b is mounted to the base member 183. The driving source 184c is, by way of non-limiting example, a motor, and is fixed to the base member 183 and configured to rotate the screw shaft 184b.

The driving device 184 rotates the screw shaft 184b by using the driving source 184c, thus allowing the slider 184a fixed to the screw shaft 184b to be moved in the X-axis direction. Accordingly, the driving device 184 is capable of rotating the rotation shaft 181 fixed to the slider 184a. A range in which the driving device 184 rotates the rotation shaft 181 is, for example, ±1°.

The position sensor 185 is, by way of non-limiting example, a linear scale. The position sensor 185 is fixed to the base member 183, and detects a position of the rotation shaft 181 in the horizontal direction. Here, though not shown, the position sensor 185 is plural in number, and these position sensors 185 are arranged at the side surface of the second flange member 181c of the rotation shaft 181. For example, in addition to the position shown in FIG. 4, the rotating device 108 may be equipped with position sensors 185 respectively provided at positions where the driving device 184 and the damping device 186 are provided. The bonding apparatus 41 is capable of measuring a rotation amount (rotation angle) of the rotation shaft 181 and an eccentric amount of the rotation shaft 181 by using these position sensors 185.

The damping device 186 produces a damping force against a relative operation between the rotation shaft 181 and the base member 183.

<Configuration of Damping Device>

Figure 5:
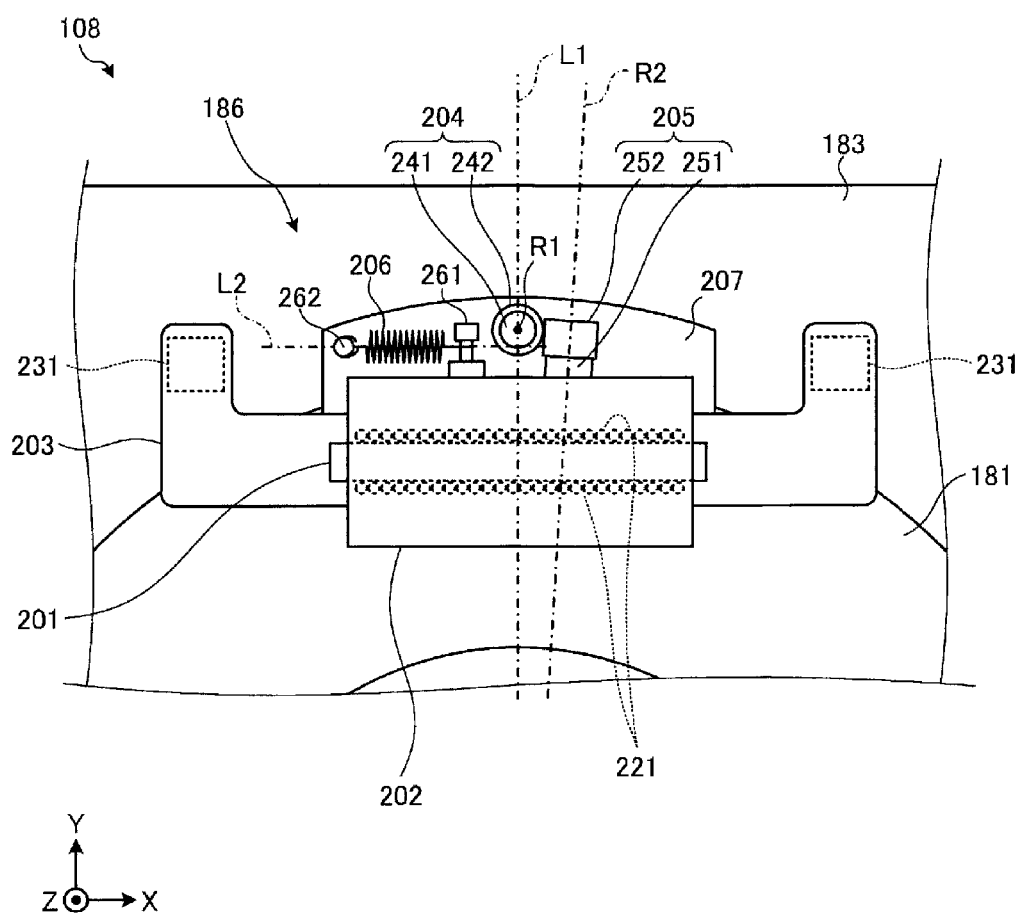
FIG. 5 is a plan view of a damping device according to the exemplary embodiment.

Now, a configuration of the damping device 186 will be explained with reference to FIG. 5. FIG. 5 is a plan view of the damping device 186 according to the exemplary embodiment.

As depicted in FIG. 5, the damping device 186 according to the exemplary embodiment includes a rail 201 and a slider 202 configured to be linearly movable with respect to the rail 201. The damping device 186 according to the exemplary embodiment produces the damping force against the relative operation between the rotation shaft 181 and the base member 183 by a resistance which is generated between the rail 201 and the slider 202.

Here, the relative operation between the rotation shaft 181 and the base member 183 implies a displacement of the rotation shaft 181 with respect to the base member 183 (this displacement is detected by the position sensor 185). The relative operation between the rotation shaft 181 and the base member 183 includes a horizontal movement of the rotation shaft 181 as well as a rotational movement of the rotation shaft 181 around the rotation center R0, for example.

The horizontal movement of the rotation shaft 181 implies a deviation (eccentricity) of the rotation center R0 in the horizontal direction. The horizontal movement of the rotation shaft 181 may be caused by an external factor such as a vibration. If the base member 183 vibrates due to the external factor, the air bearings 182 fixed to the base member 183 also vibrate. As a result, the position where the forces of the compressed air discharged from the plurality of air bearings 182 are balanced is changed, causing the rotation shaft 181 to be moved horizontally. To be specific, the rotation shaft 181 (that is, the rotation center R0) vibrates in a nanometer (nm) range.

The rail 201 is fixed to the base member 183 with a first mounting member 203 therebetween. The first mounting member 203 has a plurality of (here, two) columns 231 fixed to the base member 183, and supports the rail 201 at a higher position than the rotation shaft 181. The rail 201 is of a straight line shape and extends in the horizontal direction (here, the X-axis direction).

The slider 202 is connected to the rail 201 with a bearing 221 therebetween, and is moved along the rail 201. The slider 202 is connected to the rotation shaft 181 with a first rotation member 204 and a second rotation member 205 to be described later therebetween, and is moved on the rail 201, keeping up with the movement of the rotation shaft 181.

The damping device 186 also includes the first rotation member 204, the second rotation member 205, and a biasing member 206.

The first rotation member 204 is fixed to a second mounting member 207 which is fixed to the rotation shaft 181. The second rotation member 205 is fixed to the slider 202 and moved on the rail 201 along with the slider 202. Accordingly, the slider 202 is moved on the rail 201, following the movement of the rotation shaft 181. Further, the second mounting member 207 may be provided with the aforementioned position sensor 185 (linear scale).

The first rotation member 204 is, for example, a cam follower, and equipped with a first rotation shaft 241 and a first rotary body 241. The first rotation shaft 241 extends in the vertical direction. A base end of the first rotation shaft 241 is fixed to the second mounting member 207, and the first rotation shaft 241 supports the first rotary body 242 in a rotatable manner with a leading end thereof. The first rotary body 242 is, for example, a cylindrical roller, and is pivoted around a rotation axis R1 which extends vertically.

The second rotation member 205 is, for example, a cam follower, and equipped with a second rotation shaft 251 and a second rotary body 252. The second rotation shaft 251 extends in the horizontal direction. A base end of the second rotation shaft 251 is fixed to the slider 202, and the second rotation shaft 251 supports the second rotary body 252 in a rotatable manner with a leading end thereof. The second rotary body 252 is, for example, a cylindrical roller, and is pivoted around a rotation axis R2 which extends horizontally. The second rotation member 205 is disposed at the positive X-axis side of the first rotation member 204.

FIG. 5 illustrates the rotating device 108 in an initial state when a driving force by the driving device 184 does not act on the rotation shaft 181. In this initial state, the first rotary body 242 of the first rotation member 204 and the second rotary body 252 of the second rotation member 205 are in contact with each other. This contact state between the first rotary body 242 and the second rotary body 252 is maintained by the biasing member 206 to be described later.

Further, in the initial state, the rotation axis R2 of the second rotation member 205 is inclined with respect to a straight line L1 connecting the rotation center R0 (see FIG. 4) of the rotation shaft 181 and the rotation axis R1 of the first rotation member 204. An angle formed by the rotation axis R2 and the straight line L1 is set to be larger than the rotation range (e.g., ±1°) of the rotation shaft 181. For example, the angle formed by the rotation axis R2 and the straight line L1 is larger than 1° to and smaller than 10°.

The biasing member 206 applies a force to the first rotary body 242 of the first rotation member 204 and the second rotary body 252 of the second rotation member 205 in a direction in which they are allowed to be in contact with each other. The biasing member 206 is, for example, a tension coil spring, and is disposed in parallel with the rail 201. To elaborate, an imaginary spring axis L2 of the biasing member 206 extends in the X-axis direction. One end of the biasing member 206 is mounted to a first column 261 which is fixed to the slider 202. Further, the other end of the biasing member 206 is mounted to a second column 262 which is fixed to the second mounting member 207.

Furthermore, in the initial state, the aforementioned straight line L1 extends in the Y-axis direction and intersects with the spring axis L2 of the biasing member 206 at a right angle.

The biasing member 206 applies the force to the slider 202 in the negative X-axis direction. As a result, the force is applied to the second rotation member 205, which is fixed to the slider 202, in the negative X-axis direction, that is, in the direction in which the second rotation member 205 comes into contact with the first rotation member 204. Accordingly, the state in which the first rotary body 242 of the first rotation member 204 and the second rotary body 252 of the second rotation member 205 are in contact with each other is maintained.

By way of example, if a micro-vibration is applied to the rotation shaft 181 due to an external factor, the vibration of the rotation shaft 181 is transferred to the rail 201 via the slider 202. As stated above, a sliding resistance, specifically, a rolling resistance of the bearing 221 exists between the rail 201 and the slider 202. This resistance serves as the damping force against the relative operation between the rotation shaft 181 and the base member 183, so that the vibration of the rotation shaft 181 can be suppressed. That is, the static balance of the rotation shaft 181 can be improved.

As described above, the damping device 186 according to the exemplary embodiment generates the damping force against the relative operation between the rotation shaft 181 and the base member 183, and is thus capable of improving the static balance of the rotation center R0 even if the rotation shaft 181 is supported in the non-contact state. Thus, according to the bonding apparatus 41 of the present exemplary embodiment, the positioning accuracy of the first substrate W1 can be improved, and, besides, the bonding accuracy of the first substrate W1 and the second substrate W2 can be improved.

Specifically, the bearing 221 is a ball bearing. Instead, however, it may be a roller bearing. Since the roller bearing is of a surface-contact type, it has high vibration controllability, as compared to a point-contact type bearing such as the ball bearing. Thus, by using the roller bearing, the static balance for the relative operation between the rotation shaft 181 and the base member 183 can be further improved. Moreover, a shaft supporting member for the slider 202 is not merely limited to the bearing 221, and a ball bearing may be used.

In addition, the damping device 186 according to the exemplary embodiment has a link mechanism composed of the first rotation member 204 and the second rotation member 205. Accordingly, the damping device 186 of the present exemplary embodiment is capable of connecting the base member 183 and the rotation shaft 181 mechanically while absorbing the error between the rotational movement of the rotation shaft 181 and the linear movement of the slider 202 through the rotational movements of the first rotary body 242 and the second rotary body 252.

Further, the first rotation member 204 and the second rotation member 205 are maintained in contact with each other by the biasing force of the biasing member 206. Most of the biasing force of this biasing member 206 is exerted to press the second rotation member 205 against the first rotation member 204. As stated above, however, the rotation axis R2 of the second rotation member 205 is inclined with respect to the straight line L1 connecting the rotation center R0 (see FIG. 4) of the rotations shaft 181 and the rotation axis R1 of the first rotation member 204. That is, the rotation axis R2 of the second rotation member 205 and the spring axis L2 of the biasing member 206 are inclined with respect to a right angle. Accordingly, a part of the biasing force of the biasing member 206 serves as a force by which the rotation shaft 281 is rotated in a direction in which the inclination of the rotation axis R2 is removed, that is, in a counterclockwise direction here. This force serves as a pre-load for the rotation shaft 181.

In this way, by applying the pre-load to the rotation shaft 181, strength of a linear system composed of the rail 201 and the slider 202 can be improved. By enhancing the strength of the linear system, the damping device 186 according to the exemplary embodiment is more strengthened against the external factor such as the vibration. Thus, more accurate positioning is enabled.

Moreover, in the damping device 186 according to the exemplary embodiment, a variation of a transformation amount (extension amount) of the biasing member 206 hardly occurs in the rotation range of the rotation shaft 181, regardless of a change in a rotation position. Therefore, it is possible to apply the substantially constant pre-load at any rotation position. Hence, according to the damping device 186 of the exemplary embodiment, a fluctuation in the positioning accuracy, which is caused by the variation of the pre-load, can be avoided and the static balance can be improved.

When the rotating device 108 is seen from the vertical direction in the initial state shown in FIG. 5, the rotation axis R1 of the first rotation member 204 is located at an outer side than the imaginary spring axis L2 of the biasing member 206 with respect to the rotation shaft 181. With this layout, as compared to a case in which the spring axis L2 is located at an outer side than the rotation axis R1, an unnecessary force other than the force in the rotational direction, for example, a force by which the rotation center R0 is moved can be suppressed from being applied to the rotation shaft 181. Thus, with the damping device 186 according to the exemplary embodiment, the positioning accuracy for the first substrate W1 can be further improved.

The slider 202 of the damping device 186 is disposed at an opposite side from the slider 184a of the driving device 184 with the center of the rotation shaft 181 therebetween (see FIG. 4 and FIG. 5). By locating the damping device 186 at this position, the damping force can be produced effectively.

<Operation of Bonding System>

Figure 6:
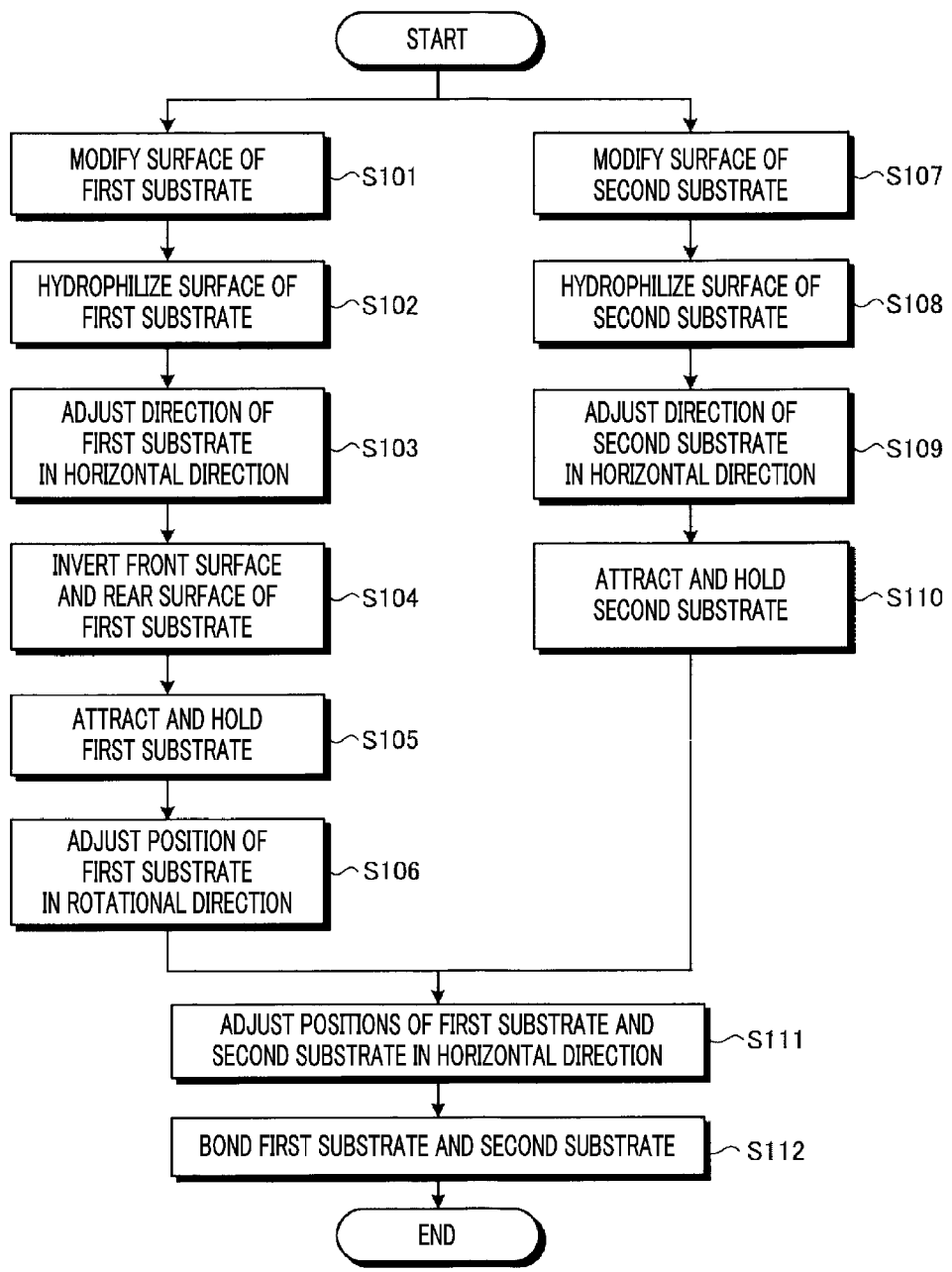
FIG. 6 is a flowchart illustrating a sequence of a processing performed by the bonding system according to the exemplary embodiment.

Now, a specific operation of the bonding system 1 will be described with reference to FIG. 6. FIG. 6 is a flowchart illustrating a sequence of a processing performed by the bonding system 1 according to the exemplary embodiment. Various processes shown in FIG. 6 are performed under the control of the control device 70.

First, the cassette C1 accommodating the first substrates W1, the cassette C2 accommodating the second substrates W2, and the empty cassette C3 are placed on the preset placing plates 11 of the carry-in/out station 2. Then, the first substrate W1 is taken out form the cassette C1 by the transfer device 22, and transferred into the transition device within the third processing block G3.

Then, the first substrate W1 is transferred into the surface modifying apparatus 30 of the first processing block G1 by the transfer device 61. In the surface modifying apparatus 30, an oxygen gas as a processing gas is formed into plasma to be ionized under a preset decompressed atmosphere. Oxygen ions are radiated to the bonding surface of the first substrate W1, so that the bonding surface is plasma-processed. As a result, the bonding surface of the first substrate W1 is modified (process S101).

Subsequently, the first substrate W1 is transferred into the surface hydrophilizing apparatus 40 of the first processing block G1 by the transfer device 61. In the surface hydrophilizing apparatus 40, pure water is supplied onto the first substrate W1 while rotating the first substrate W1 held by the spin chuck. Accordingly, the bonding surface of the first substrate W1 is hydrophilized. Further, the bonding surface of the first substrate W1 is cleaned by this pure water (process S102).

Thereafter, the first substrate W1 is transferred into the bonding apparatus 41 of the second processing block G2 by the transfer device 61. The first substrate W1 carried into the bonding apparatus 41 is then transferred into the position adjusting device via the transition device, and the direction of the first substrate W1 in the horizontal direction is adjusted by the position adjusting device (process S103).

Next, the first substrate W1 is delivered to the inverting device from the position adjusting device, and the front surface and the rear surface of the first substrate W1 are inverted by the inverting device (process S104). To elaborate, the bonding surface W1j of the first substrate W1 is turned to face down. Then, the first substrate W1 is delivered to the first holder 101 from the inverting device, and attracted to and held by the first holder 101 (process S105).

Subsequently, the position adjustment of the first substrate W1 in the rotational direction is performed by using the rotating device 108 (process S106). Then, the lifting of the rotation shaft 181 by the plurality of air bearings 182 is released, and the rotation shaft 181 is attracted to the air bearings 182 by using a non-illustrated exhaust device. Accordingly, the rotation shaft 181 is fixed in the state that its position in the rotational direction is adjusted.

In parallel with the processing of the processes S101 to S106 upon the first substrate W1, the processing of the second substrate W2 is performed. First, the second substrate W2 is taken out of the cassette C2 by the transfer device 22, and transferred into the transition device placed in the third processing block G3.

Then, the second substrate W2 is transferred into the surface modifying apparatus 30 by the transfer device 61, and the bonding surface W2j of the second substrate W2 is modified (process S107). Thereafter, the second substrate W2 is transferred into the surface hydrophilizing apparatus 40 by the transfer device 61, and the bonding surface W2j of the second substrate W2 is hydrophilized and cleaned (process S108).

Subsequently, the second substrate W2 is transferred into the bonding apparatus 41 by the transfer device 61. The second substrate W2 carried into the bonding apparatus 41 is delivered to the position adjusting device via the transition device. Then, the direction of the second substrate W2 in the horizontal direction is adjusted by the position adjusting device (process S109).

Afterwards, the second substrate W2 is transferred to the second holder 102 and attracted to and held by the second holder 102 with a notch thereon oriented toward a predetermined direction (process S110).

Next, the position adjustment between the first substrate W1 held by the first holder 101 and the second substrate W2 held by the second holder 102 in the horizontal direction is performed (process S111). Then, the second substrate W2 is raised by using the elevating device 105, allowing the first substrate W1 and the second substrate W2 to be bonded to each other (process S112). Specifically, in the process S112, after the second substrate W2 is raised, the center of the first substrate W1 may be pressed downwards by using a non-illustrated pressing member provided at the first holder 101 to come into contact with the center of the second substrate W2.

As stated above, the substrate positioning apparatus (the bonding apparatus 41 as an example) according to the exemplary embodiment includes the holder (the first holder 101 as an example) and the rotating device (the rotating device 108 as an example). The holder holds the substrate (the first substrate W1 as an example). The rotating device rotates the holder. Further, the rotating device is equipped with the rotation shaft (the rotation shaft 181 as an example), the bearing member (the air bearings 182 as an example), the base member (the base member 183 as an example), the driving unit (the driving device 184 as an example), and the damping device (the damping device 186 as an example). The rotation shaft is fixed to the holder. The bearing member supports the rotation shaft in the non-contact state. The base member holds the bearing member fixed thereon. The driving unit rotates the rotation shaft. The damping device is equipped with the rail (the rail 201 as an example) connected to the base member and the slider (the slider 202 as an example) connected to the rotation shaft, and produces the damping force against the relative operation between the rotation shaft and the base member by the resistance generated between the rail and the slider. Thus, in the substrate positioning apparatus according to the exemplary embodiment, the substrate positioning accuracy can be improved.

The damping device includes the first rotation member (the first rotation member 204 as an example), the second rotation member (the second rotation member 205 as an example), and the biasing member (the biasing member 206 as an example). The first rotation member is fixed to the rotation shaft. The second rotation member is fixed to the slider. The biasing member applies the force in the direction in which the first rotation member and the second rotation member are allowed to be in contact with each other.

With this configuration, the base member and the rotation member can be connected mechanically while absorbing the error between the rotational movement of the rotation shaft and the linear movement of the slider through the rotational movements of the first rotation member and the second rotation member.

The first rotation member is configured to be pivotable around the vertical axis (the rotation axis R1 as an example), and the second rotation member is configured to be pivotable around the horizontal axis (the rotation axis R2 as an example). Further, when the rotating device is seen from the vertical direction in the initial state when the driving force by the driving unit does not act on the rotation shaft, the horizontal axis of the second rotation member is inclined with respect to the straight line (the straight line L1 as an example) connecting the center of the rotation shaft and the vertical axis of the first rotation member.

With this configuration, the pre-load can be applied to the rotation shaft. Accordingly, the strength of the linear system composed of the rail and the slider can be improved. By enhancing the strength of the linear system, the linear system is more strengthened against the external factor such as the vibration, so that the more accurate positioning is enabled.

The biasing member is the spring. When the rotating device is seen from the vertical direction in the initial state when the driving force by the driving unit does not act on the rotation shaft, the vertical axis of the first rotation member is located at the outer side than the imaginary spring axis (the spring axis L2 as an example) of the biasing member with respect to the rotation shaft. With this layout, the substrate positioning accuracy can be further improved.

The damping device is disposed at the opposite side from the driving unit with the center of the rotation shaft therebetween. By locating the damping device at this position, the damping force can be produced effectively.

So far, the exemplary embodiments have been described. However, it should be noted that the above-described exemplary embodiments are illustrative in all aspects and are not anyway limiting. The above-described exemplary embodiments may be omitted, replaced and modified in various ways without departing from the scope and the spirit of claims.

According to the exemplary embodiment, it is possible to improve the substrate positioning accuracy.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate positioning apparatus, comprising:
a holder configured to hold a substrate; and
a rotating device configured to rotate the holder,
wherein the rotating device comprises:
a rotation shaft fixed to the holder;
a bearing member configured to support the rotation shaft in a non-contact state;
a base member on which the bearing member is fixed;
a driving unit configured to rotate the rotation shaft; and
a damping device, comprising:
   a rail connected to the base member;
   a slider connected to the rotation shaft;

a first rotation member fixed to the rotation shaft;
a second rotation member fixed to the slider; and
a biasing member configured to apply a force in a direction in which the first rotation member and the second rotation member are allowed to be in contact with each other,
wherein the damping device is configured to produce a damping force against a relative operation between the rotation shaft and the base member by a resistance generated between the rail and the slider.

2. The substrate positioning apparatus of claim 1,
wherein the bearing member is an air bearing, and supports the rotation shaft in the non-contact state by allowing the rotation shaft to be lifted while discharging compressed air to a bearing surface of the rotation shaft.

3. The substrate positioning apparatus of claim 1,
wherein the rail is of a straight line shape.

4. The substrate positioning apparatus of claim 1,
wherein the first rotation member is configured to be rotated around a vertical axis,
the second rotation member is configured to be rotated around a horizontal axis, and
when the rotating device is seen from a vertical direction in an initial state where a driving force by the driving unit does not act on the rotation shaft, the horizontal axis of the second rotation member is inclined with respect to a straight line connecting a rotation center of the rotation shaft and the vertical axis of the first rotation member.

5. The substrate positioning apparatus of claim 4,
wherein the biasing member is a spring, and
when the rotating device is seen from the vertical direction in the initial state when the driving force by the driving unit does not act on the rotation shaft, the vertical axis of the first rotation member is located at an outer side than an imaginary spring axis of the biasing member with respect to the rotation shaft.

6. The substrate positioning apparatus of claim 1,
wherein the damping device is disposed at an opposite side from the driving unit with a center of the rotation shaft therebetween.

7. A substrate positioning method, comprising:
holding a substrate by using a holder configured to hold the substrate; and
performing positioning of the substrate in a rotational direction by using a rotating device configured to rotate the holder,
wherein the rotating device comprises:
a rotation shaft fixed to the holder;
a bearing member configured to support the rotation shaft in a non-contact state;
a base member on which the bearing member is fixed;
a driving unit configured to rotate the rotation shaft; and
a damping device, comprising:
a rail connected to the base member;
a slider connected to the rotation shaft
a first rotation member fixed to the rotation shaft;
a second rotation member fixed to the slider; and
a biasing member configured to apply a force in a direction in which the first rotation member and the second rotation member are allowed to be in contact with each other,
wherein the damping device is configured to produce a damping force against a relative operation between the rotation shaft and the base member by a resistance generated between the rail and the slider.

8. A bonding apparatus, comprising:
a first holder configured to hold and attract a first substrate from above;
a second holder disposed under the first holder and configured to hold and attract a second substrate from below;
a moving device configured to allow a first one of the first holder and the second holder to approach a second one of the first holder and the second holder; and
a rotating device configured to rotate the first holder,
wherein the rotating device comprises:
a rotation shaft fixed to the first holder;
a bearing member configured to support the rotation shaft in a non-contact state;
a base member on which the bearing member is fixed;
a driving unit configured to rotate the rotation shaft; and
a damping device, comprising:
a rail connected to the base member; and
a slider connected to the rotation shaft,
wherein the damping device is configured to produce a damping force against a relative operation between the rotation shaft and the base member by a resistance generated between the rail and the slider.

* * * * *